(12) United States Patent
Bogner

(10) Patent No.: US 7,053,711 B2
(45) Date of Patent: May 30, 2006

(54) MULTISTAGE DIFFERENTIAL AMPLIFIER

(75) Inventor: Peter Bogner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/944,681

(22) Filed: Sep. 17, 2004

(65) Prior Publication Data

US 2005/0116777 A1 Jun. 2, 2005

(30) Foreign Application Priority Data

Sep. 19, 2003 (DE) ................................ 103 43 567

(51) Int. Cl.
H03F 3/45 (2006.01)

(52) U.S. Cl. ........................ 330/253; 330/257; 330/258

(58) Field of Classification Search ................ 330/253, 330/257, 258

See application file for complete search history.

(56) References Cited

U.S. PATENT DOCUMENTS 5,955,922 A 9/1999 Nicollini et al.

| 6,317,068 | B1* | 11/2001 | Gattani et al. .............. 341/150 |
| 6,335,655 | B1* | 1/2002 | Yamamoto ................... 327/552 |
| 6,697,001 | B1* | 2/2004 | Oliaei et al. ................ 341/143 |
| 6,812,784 | B1* | 11/2004 | Michalski ....................... 330/9 |
| 2003/0048134 | A1 | 3/2003 | Ramazan et al. |

FOREIGN PATENT DOCUMENTS

DE 101 42 707 A1 4/2003

* cited by examiner

*Primary Examiner*—Patricia Nguyen
(74) *Attorney, Agent, or Firm*—Miginot, Moore & Beck

(57) ABSTRACT

The invention relates to a multistage differential amplifier circuit having a multistage differential amplifier which has an input stage and at least one output stage connected downstream of the input stage, having a CMFB circuit whose input side is connected to outputs on the output stage, having a first control loop, which can be used to set a load for the input stage using a first control signal from the CMFB circuit, having at least one second control loop, which is arranged between the outputs of the output stage and a control input on the CMFB circuit and which uses an output common-mode level which can be tapped off at the output stage to produce a continuous-time, second control signal for setting an operating point for the CMFB circuit.

20 Claims, 2 Drawing Sheets

MULTISTAGE DIFFERENTIAL AMPLIFIER

The invention relates to a multistage differential amplifier circuit.

FIELD OF THE INVENTION

Differential amplifiers are some of the most important basic circuits in analog integrated circuits. A differential amplifier has two inputs and two outputs, the output voltage being largely proportional to the differential voltage applied between the two input connections. A differential amplifier that is fully differential normally requires a "CMFB (Common-mode Feedback Circuit) circuit" for setting the common-mode voltage, which is normally in the middle between the positive and the negative supply voltage ((VDD+VSS)/2). This voltage is subsequently referred to as the mean DC voltage or as the output common-mode level.

BACKGROUND

FIG. 1 uses a circuit diagram to show the basic design of a generally known differential amplifier DV with a CMFB circuit CMFB. The differential amplifier DV has two inputs, to which a differential input voltage Vindiff is applied, and two outputs, at which a differential, amplified output voltage Voutdiff can be tapped off. The differential amplifier DV also has a control input into which a control signal Incntrl can be input. The CMFB circuit CMFB is in this case arranged in parallel between the outputs of the differential amplifier DV and the latter's control connection. The CMFB circuit CMFB is used for regulating a common-mode voltage produced at the output of the differential amplifier DV to a nominal value between the supply voltage. To this end, the CMFB circuit CMFB produces a control signal Incntrl which is derived from the output voltage Voutdiff and which is fed back to the control input of the differential amplifier DV. In differential amplifiers DV that are fully differential, the mean DC voltage ((VDD+VSS)/2) (common-mode voltage) produced at the output is not determined by the differential voltage Vindiff at the input, but rather is also determined by the controlled variable Incntrl.

Differential amplifiers may be in single-stage, two-stage or multistage form. For higher gains, two-stage or multistage differential amplifiers are therefore usually used.

FIG. 2 uses a circuit diagram to show a generally known differential amplifier with continuous-time common-mode control. This two-stage differential amplifier has an input stage A and an output stage B. To actuate the load for the input stage A, a continuous-time common-mode controller C is provided, to which an output signal tapped off from the output signal from the differential amplifier is supplied as controlled variable. Although a differential amplifier with such continuous-time CMFB control has a high level of stability in the signal which is to be amplified, this results (in order to provide very fast control in the common-mode controller C) in a very large current and hence in a high power consumption in the common-mode control amplifier C. For many applications, a high power consumption is not desirable and is frequently not acceptable, however. Fast control, on the other hand, is indispensable in order to prevent oscillations from arising in the control circuit.

U.S. Pat. No. 5,955,922 describes a differential amplifier with a CMFB circuit in which, unlike in the case of the continuous-time common-mode control just described, the common-mode value is set by switched capacitances (switched capacitor). Such differential amplifiers with switched capacitances have the particular advantage that a common-mode value is set by the switched capacitances, which means that controlling the differential amplifier thus consumes hardly any current. Setting the common-mode value using switched capacitances is therefore particularly advantageous, particularly for single-stage differential amplifiers.

Besides a single-stage differential amplifier, U.S. Pat. No. 5,955,922 also describes a two-stage or multistage differential amplifier with switched capacitances. However, the problem with such multistage differential amplifiers with switched capacitances is that they tend to have instabilities in the control as the number of amplifier stages increases. In particular, the common-mode value begins to oscillate as the number of differential amplifier stages increases. To rectify this, the differential amplifier described in U.S. Pat. No. 5,955,922 provides additional amplifier stages in the signal path. Although this makes the control more stable, it first of all has an adverse effect on the speed of the differential amplifier. Secondly, the differential amplifier consumes more current, which is something to be avoided as far as possible, particularly for a low power consumption.

DE 101 42 707 A1 describes a multistage differential amplifier circuit in which the CMFB circuit has switched capacitances. In this case, an input-side common-mode controller is provided. To ensure adequate stability for the common-mode control, the differential amplifier has a current source which, if too small a current flows in the feedback loop, feeds an additional current into the feedback loop. Although the differential amplifier circuit described therein thus has an adequately high level of stability, the current delivered by this current source is to a certain extent a control stop for the common-mode control. The problem in this case is that if the common-mode value has relatively large discrepancies—which is very often the case—the control in this circuit very quickly hits a control stop, which means that the control does not work or no longer works satisfactorily, however. The CMFB circuit described in DE 101 42 701 A1 therefore has the drawback of a very limited input range for the common-mode value which can be used.

SUMMARY

The present invention is therefore based on the object of specifying a multistage differential amplifier circuit which has as low a power consumption as possible and nevertheless has as high a level of stability for the common-mode control as possible. The inventive differential amplifier circuit should also have as large a control range as possible.

An embodiment of the invention provides a differential amplifier circuit having a multistage differential amplifier which has an input stage and at least one output stage connected downstream of the input stage, having a CMFB circuit whose input side is connected to outputs on the output stage, having a first control loop, which can be used to set a load for the input stage using a first control signal from the CMFB circuit, having at least one second control loop, which is arranged between the outputs of the output stage and a control input on the CMFB circuit and which uses an output common-mode level which can be tapped off at the output stage to produce a continuous-time, second control signal for setting an operating point for the CMFB circuit.

The idea on which the present invention is based involves combining the advantages of common-mode control using switched capacitances with the advantages of continuous-time common-mode control. To this end, the invention provides two-part common-mode control. The actual common-mode control is performed using the switched capacitances, and the bias voltage for the common-mode value is set using continuous-time control. The switched capacitances can thus be used to provide very fast control, whereas the continuous-time control takes place relatively slowly, but this is entirely adequate.

The insight on which the present invention is based is that the actual common-mode control needs to take place relatively quickly, particularly for reasons of stability. For this fast control, the inventive control device is equipped with switched capacitances to which the output-side differential voltage from the differential amplifier is supplied. The switched capacitances are used to perform the actual switched control of the common-mode value, which means that very fast control can be provided here. In this case, the control signal is produced by means of charge transfer in the switched capacitances. The particular advantage is now that this charge transfer can be performed almost at zero current and hence almost without any power consumption. Hence, this provides not only high dynamic control which is very advantageous particularly for reasons of stability, but also control which is very advantageous in terms of power.

To permit the desired dynamics for the control, at least those capacitors in the switched capacitances which are connected to the outputs of the differential amplifier and which thus have the output-side differential voltage applied to them should be biased to a reference voltage or reference potential as far as possible. In line with the invention, this reference bias voltage is provided by the continuous-time control device. The continuous-time controller required for this is of relatively slow and hence current-saving design, particularly for power reasons. However, the speed is not actually relevant in this case, since in this case only the capacitors in the switched capacitances need to be charged with a bias voltage, without any time criticality. This charging requires relatively small currents, which means that the continuous-time controller consumes relatively little current and thus has a very low power consumption. As a result, the transistors in the continuous-time controller may also be given correspondingly small dimensions.

The result of this is that the transistors in the continuous-time controller require comparatively little chip area. Since the capacitors in the switched capacitances require little chip area anyway, the entire control circuit comprising continuous-time controller and controller with switched capacitances can be produced using a very much smaller chip area in comparison with the common-mode control circuits described at the outset.

The inventive differential amplifier circuit is suitable for all such applications as are intended to amplify a differential voltage and are intended to use common-mode control for fast, dynamic control, which requires as low a current consumption as possible and hence as low a power consumption as possible. The inventive differential amplifier circuit is thus particularly suitable for applications with a local power supply, such as mobile radio applications or broadband telephone applications (wireless base station). In addition, the inventive differential amplifier circuit is above all suitable for circuit arrangements with switched capacitances, such as sigma-delta A/D converters and "pipeline A/D converters".

Advantageous refinements and developments of the invention are the subject matter of the subclaims and also of the description with reference to the drawing.

BRIEF DESCRIPTION OF THE DRAWINGS

The invention is explained in more detail below with reference to the exemplary embodiments indicated in the figures of the drawing, in which.

DETAILED DESCRIPTION

Figure 1:
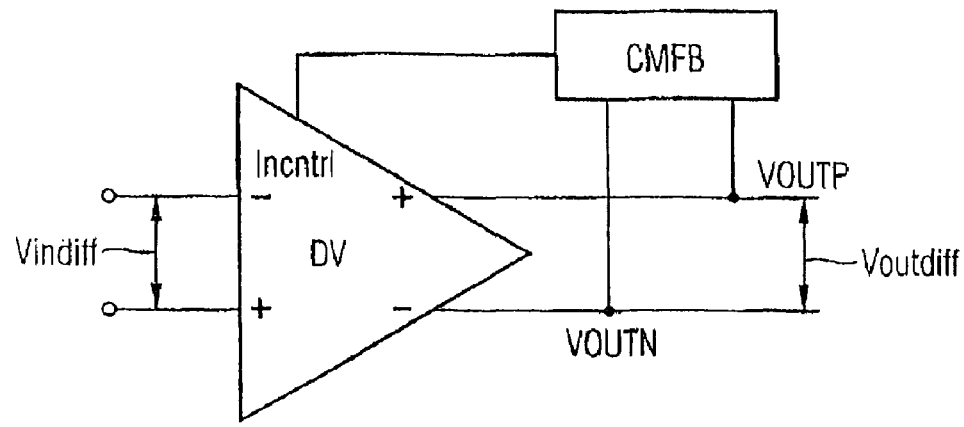
FIG. 1 shows a basic circuit diagram of a generally known differential amplifier with a CMFB circuit.
Figure 2:
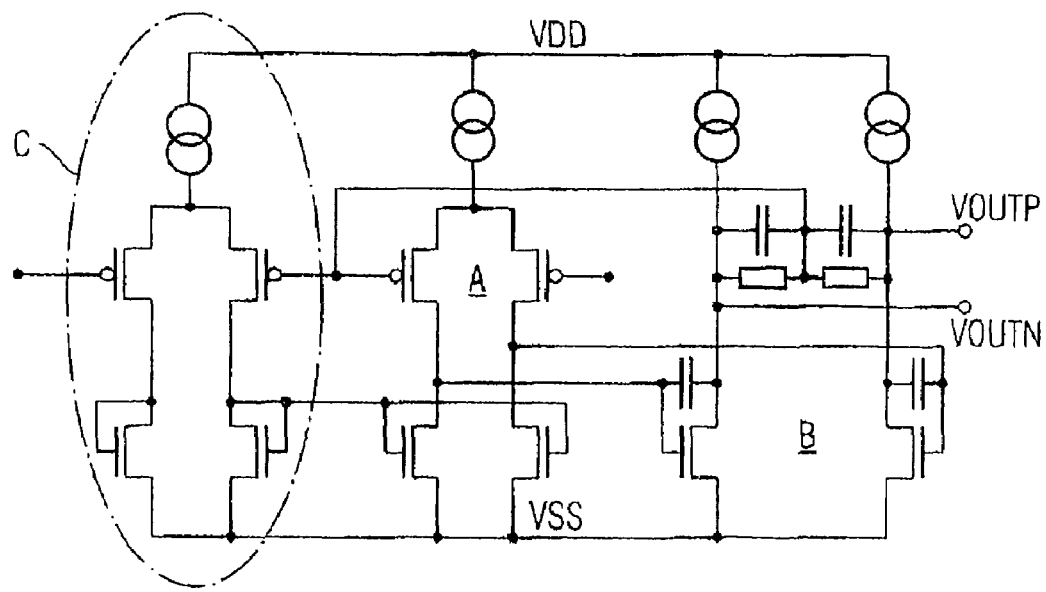
FIG. 2 shows a generally known differential amplifier with continuous-time common-mode control.
Figure 3:
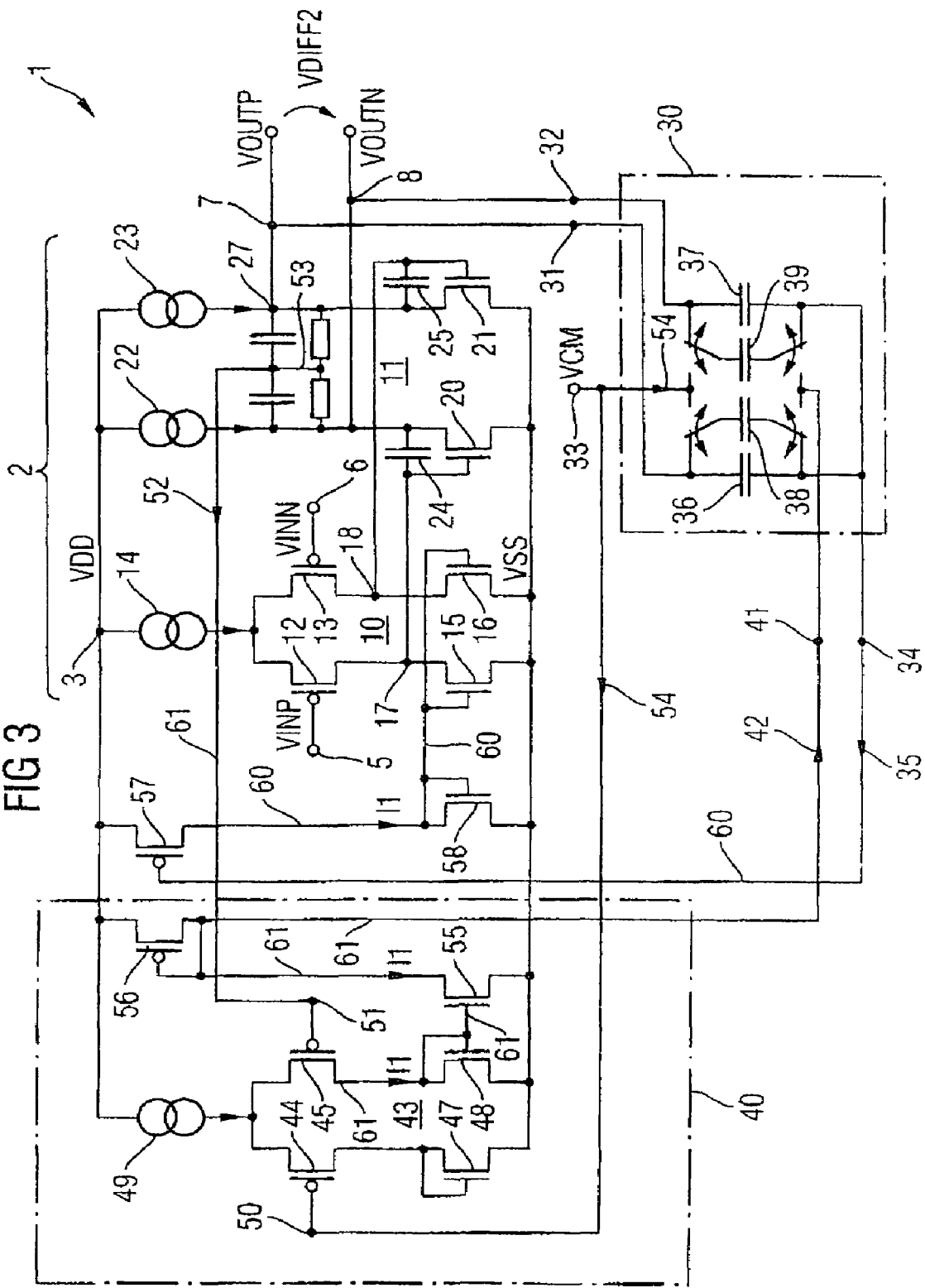
FIG. 3 shows a multistage differential amplifier circuit based on the invention with switched capacitances for the common-mode control.

In FIG. 3, reference symbol 1 denotes the inventive differential amplifier circuit with common-mode control. The differential amplifier circuit 1 has a two-stage differential amplifier 2. The differential amplifier 2 is arranged between a first supply connection 3 with a first supply potential VDD, for example a positive supply potential, and a second supply connection 4 with a second supply potential, for example a negative supply potential VSS. In addition, the differential amplifier 2 has two input connections 5, 6 and two output connections 7, 8. The first input connection 5 can have a first input potential VINP input into it, and the second input connection 6 can have a second input potential VINN input into it. A first output potential VOUTN can be tapped off at the first output connection 7, and a second output potential VOUTP can be tapped off at the second output connection 8.

The differential amplifier 2 contains an input stage 5 and an output stage 6. The input stage 10 comprises two transistors 12, 13, whose control connections are connected to the input connections 5, 6, in a manner which is known per se. The controlled paths of these two transistors 12, 13 are shorted to one another on the supply side and are connected to the first supply connection 3 via a current source 14. The two transistors 12, 13 are connected to the second supply connection 4 on the load side via a respective transistor 15, 16 (acting as a load) whose controlled paths are arranged in series with those of the transistors 12, 13. The respective center taps 17, 18 between the transistors 12, 13 and 15, 16 form the outputs 17, 18 of the input stage 10.

The output stage 11 contains two transistors 20, 21 whose controlled paths are connected firstly to the second supply connection 4 and secondly via a respective current source 22, 23 to the first supply connection 3. The control connections of the transistors 20, 21 are respectively connected to one of the outputs 17, 18 of the input stage 10. Arranged in parallel with the control connections and output-side load connections of the transistors 20, 21, that is to say in parallel with the latter's drain/source path, is a respective compensation capacitor 24, 25, which may be in the form of a Miller capacitance, for example. A respective tap 26, 27 between the controlled paths of the transistors 20, 21 and the respective current sources 22, 23 arranged in series therewith forms the two outputs 7, 8 of the differential amplifier 2.

A differential voltage VDIFF1=VINP−VINN which is input via the inputs 5, 6 turns on the respective transistors 12, 13 as appropriate, so that a current produced by the current source 14 flows through the load path in the transistors 12, 13. The load transistors 15, 16, which act as an I/U converter, convert this current I1 into a respective potential which can be tapped off at the outputs 17, 18 and can be used to actuate the gate connections of the transistors 20, 21 in the output stage 11. The transistors 20, 21 are then turned on in line with the voltage drop across the Miller capacitances 24, 25 between the drain connection and the source connection of these transistors. The current sources 22, 23 thus produce a flow of current, which means that an amplified active voltage VDIFF2=VOUTN−VOUTP can be tapped off at the outputs 7, 8.

In addition, the inventive differential amplifier circuit has a common-mode control circuit 30, 40. This common-mode control circuit is of two-part design and contains a switched control circuit 30 and also a continuous-time control circuit 40.

The switched control circuit 30 essentially comprises a network containing switched capacitances 30, which is subsequently also referred to as a switched capacitor circuit. The switched control circuit 30 has two inputs 31, 32 into which the output signals VOUTN, VOUTP at the outputs 7, 8 of the differential amplifier 2 are input. The switched control circuit 30 also contains a common-mode input 33 which can be used to input an externally set common-mode value VCM into the switched control circuit 30. The switched control circuit 30 also contains an output 34 at which a control signal 35 provided by the control circuit 30 can be tapped off. Between the inputs 31, 32 and the output 34, there is a respective capacitive element 36, 37. In parallel with each of these capacitive elements 36, 37, there is a respective further capacitive element 38, 39 which can be connected in parallel with the capacitive elements 36, 37 under the control of suitable changeover apparatuses, for example controlled switches. The control of these switches is known generally, which means that it is not discussed in more detail. In another switching state, these capacitive elements 38, 39 are arranged between the common-mode connection 33 and an input connection 40. The input connection 41, which is connected to a control output 41 on the continuous-time control circuit 40, can be used to tap off a controlled bias potential 42 from the continuous-time control circuit 40.

In the steady state, the common-mode voltage VCM applied to the common-mode connection 33 corresponds to the mean DC voltage, i.e. in this case it holds true that VCM=((VOUTN+VOUTP)/2). The capacitors 36, 37 are thus charged merely by means of the capacitors 38, 39, but not by means of the potential at the outputs 7, 8.

The design and manner of operation of such a capacitive network 30 with switched capacitances is known from the printed documents U.S. Pat. No. 5,955,922 and DE 101 42 707 A1 already mentioned at the outset. The full content of these printed documents is incorporated into the present patent application with regard to the design and manner of operation of such a network with switched capacitances.

The continuous-time control circuit 40 contains an amplifier stage 43. The amplifier stage 43 forms the actual controller in the control circuit 40. In the present exemplary embodiment, the amplifier stage 43 is essentially constructed in the manner of the input stage 10 for the differential amplifier 2. A signal 52 (output common-mode level (VDD+VSS)/2)) derived from the differential voltage VDIFF2 which is provided at the output of the differential amplifier 2 is input into a first input 51 on the amplifier stage 43. This signal 52 is tapped off from a capacitive and resistive voltage divider 53 which is arranged between the outputs 26, 27 of the output stage 11. The second input 50 of the amplifier stage 43 is connected to the common-mode input 33, so that the transistor 44 is actuated using a common-mode potential VCM.

The amplifier stage 43 thus acts as a differential amplifier and compares the common-mode potential 54 with the signal 52 which is derived from the differential voltage VDIFF2 (output common-mode level ((VDD+VSS)/2)). A current I1 which is derived on the basis of this difference flows through the transistor 48. The transistor 48 forms a current mirror together with the transistor 55, which means that the current I1—given the same transformation and aspect ratio—also flows through the transistor 55. On the supply side, a transistor diode 56 is arranged between the transistor 55 and the connection 3. Hence, a bias potential 42 is provided, which signal is produced at the output 41. This bias potential thus forms the control signal 42 and is used, given suitable connections, to charge the capacitors 38, 39. If the capacitors 38, 39 are now connected in parallel with the capacitors 36, 37, then the latter have their charge reversed, that is to say are charged and discharged, by means of the charge on the capacitors 38, 39. Hence, charge transfer takes place in this case. The charge in the capacitors 36, 37 then results in an actuation potential 35 which actuates the gate connection of the transistor 57 and charges the latter's capacitance there until the transistor 57 turns on. A load current I1 thus flows through the controlled path of the transistor 57 acting as an amplifier. The transistors 56, 57 thus form a current mirror. With suitable dimensioning of the transformation ratios and aspect ratios of the respective transistors 48, 55, 56, 57, the current produced by the transistor on the load-current side likewise has the value of the current I1. On the load side of the transistor 57, there is a transistor diode 58 which is used to actuate the gate connections of the transistors 15, 16 in the input stage 16. The current I1 is used to reverse the charge of said input stage's gate capacitances until these transistors 15, 16 turn on. These transistors 15, 16 form the load for the first differential amplifier stage 10 and thus determine the value of the potential which can be tapped off at the outputs 17, 18.

The result is that this means that a voltage difference measured in the amplifier stage 43, which voltage difference is obtained from the common-mode voltage VCM and the mean DC voltage ((VOUTP+VOUTN)/2), is supplied to the gate connections of the transistors 15, 16 via the transistors 48, 55, 56, 57, 58. Hence, a potential carry for this differential voltage occurs here. What is important in this context is merely a suitable transformation ratio as a result of the appropriate dimensioning of said transistors 48, 55, 56, 57, 58.

The switched control circuit using the switched capacitances can thus be used for very fast, switched control. Since the charge reversal on the capacitances 36, 37 by means of the capacitances 38, 39 can take place very quickly and at almost zero current, this control also consumes almost zero current. The switched capacitances thus provide almost zero power consumption. What is important in this context is that the capacitances 38, 39 are precharged to a suitable bias voltage by means of the continuous-time control circuit 40.

Since the corresponding currents for precharging the capacitors 38, 39 are relatively small, the transistors in the continuous-time control circuit can be given relatively small dimensions, which means that chip area can be saved in this case. In addition, this continuous-time control has relatively low time criticality, which means that no fast switching operations need to be performed in this case either. The result is that this means that low circuit-related power loss is also achieved thereby. Only the transistor 57 should provide relatively fast switching operations in order to supply the corresponding control signal from the switched control circuit 30 to the input stage 10 at sufficient speed.

Since the amplitude of these currents I1 is relatively small, however, the power consumption is advantageously relatively low.

Although the present invention has been described in detail above with reference to a preferred exemplary embodiment, it is not limited thereto, but rather may be altered and modified in a wide variety of ways.

For example, the invention is particularly not limited to a two-stage differential amplifier. Rather, this differential amplifier can have any number of amplifier stages, depending on the application and depending on the desired gain.

In addition, the exemplary embodiment in FIG. 3 has described, merely by way of example, a specific circuit design for the differential amplifier, its switched control circuit and its continuous-time control circuit. It goes without saying that these circuit units can, of course, be altered or extended in suitable fashion without departing from their basic manner of operation and from the basic principle of the two-part control. In particular, it is also possible for the capacitive network with the switched capacitances to be produced with any level of complexity.

The present exemplary embodiment has respectively used NMOS and PMOS transistors which are of normally on or normally off design. It goes without saying that any circuit variants can be provided by varying these transistor types and by swapping the conductivity types N for P, and vice versa. Also, the MOS transistors used may naturally be replaced very easily with other controlled switches, for example bipolar transistors, IGBTs, thyristors, JFETs and the like. This would merely require the circuitry of the differential amplifier to be adapted in suitable fashion.

The invention claimed is:

1. An arrangement for a differential amplifier circuit having a multistage differential amplifier comprising an input stage and at least one output stage connected downstream of the input stage, the arrangement comprising:
   a common mode feedback (CMFB) circuit having an input side connected to outputs of the at least one output stage,
   a first control loop configured to control a variable load circuit for the input stage using a first control signal from the CMFB circuit,
   at least one second control loop coupled between the at least one output stage and a control input of the CMFB circuit, the at least one second control loop generated a continuous-time second control signal based on an output common-mode level ((VDD+VSS)/2) generated from a signal obtained from the at least one output stage, the continuous-time second control signal configured to set an operating point for the CMFB circuit.

2. The differential amplifier circuit as claimed in claim 1, wherein the CMFB circuit includes a capacitive network having switched capacitances.

3. The differential amplifier circuit as claimed in claim 1, wherein the at least one second control loop includes an additional control amplifier.

4. The differential amplifier circuit as claimed in claim 3, further comprising a common-mode potential input connected to at least the additional control amplifier.

5. The differential amplifier circuit as claimed in claim 4, wherein the additional control amplifier is operable to compare a common-mode potential from the common-mode potential input with the output common-mode level, and is further operable to generate the second control signal based on the comparison.

6. The differential amplifier circuit as claimed in claim 5, further comprising a voltage divider coupled between the at least one output and the additional control amplifier, the voltage divider operable to generate the output common-mode level.

7. The differential amplifier circuit as claimed in claim 1, wherein
   the first control loop includes a high speed amplifying element configured to be actuated using the first control signal, and which is operable to employ the first control signal as a basis for producing controlling the variable load circuit.

8. The differential amplifier circuit as claimed in claim 1, wherein
   the first control loop includes at least one first current mirror configured to supply the first control signal to the input stage in order to set a common-mode potential, and
   the variable load circuit constitutes a part of the at least one first current mirror.

9. The differential amplifier circuit as claimed in claim 1, wherein
   the at least one second control loop includes at least one second current mirror configured to supply the second control signal to the CMFB circuit, and
   a second transistor diode in the at least one second current mirror forms a load for the additional control amplifier.

10. The differential amplifier circuit as claimed in claim 9, wherein a transistor diode in the first current mirror is in the form of an I/U converter.

11. The differential amplifier circuit as claimed in claim 1, wherein the common-mode potential is in a form such that it corresponds to the output common-mode level ((VDD+VSS)/2).

12. The differential amplifier circuit as claimed in claim 1, wherein the differential amplifier has an even number of amplifier stages.

13. The differential amplifier circuit as claimed in claim 1, wherein at least one output of the input stage is coupled to at least one control input of the at least one output stage.

14. The differential amplifier circuit as claimed in claim 1, wherein the transistors in the differential amplifier comprise MOS transistors.

15. A differential amplifier circuit comprising:
   an input stage having differential inputs and at least one output;
   at least one output stage having at least one input operably connected to the at least one output of the input stage, the at least one output stage having differential outputs;
   a switched capacitor circuit operably coupled to at least one differential output of the at least one output stage, the switched capacitor circuit having an first control output operably connected to the input stage; and
   a continuous time control circuit having an input operably connected to the at least one output stage, and having a second control output operably connected to a control input of the switched capacitor circuit.

16. The differential amplifier circuit of claim 15 wherein the first control output is operably connected to a variable load circuit of the input stage.

17. The differential amplifier circuit of claim 16 wherein the variable load circuit comprises at least first and second MOS transistors.

18. The differential amplifier circuit of claim 15 wherein the switched capacitor circuit includes a capacitive network having switched capacitances.

19. A differential amplifier circuit comprising:
   an input stage having differential inputs and at least one output;

at least one output stage having at least one input operably connected to the at least one output of the input stage, the at least one output stage having differential outputs;

a common mode feedback circuit operably coupled to at least one differential output of the at least one output stage, the common mode feedback circuit having an first control output operably connected to the input stage;

a continuous time control circuit having an input operably connected to the at least one output stage, and having a second control output operably connected to a control input of the common mode feedback circuit.

20. The differential amplifier circuit of claim 19 wherein the first control output is operably connected to a variable load circuit of the input stage.

* * * * *